(12) United States Patent
McMillan et al.

(10) Patent No.: US 11,557,987 B2
(45) Date of Patent: Jan. 17, 2023

(54) HANDLING AND PROCESSING DOUBLE-SIDED DEVICES ON FRAGILE SUBSTRATES

(71) Applicant: Applied Materials, Inc., Santa Clara, CA (US)

(72) Inventors: Wayne McMillan, San Jose, CA (US); Visweswaren Sivaramakrishnan, Cupertino, CA (US); Joseph C. Olson, Beverly, MA (US); Ludovic Godet, Sunnyvale, CA (US); Rutger Meyer Timmerman Thijssen, Sunnyvale, CA (US); Naamah Argaman, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 17/455,312

(22) Filed: Nov. 17, 2021

(65) Prior Publication Data
US 2022/0077794 A1 Mar. 10, 2022

Related U.S. Application Data

(63) Continuation of application No. 16/713,744, filed on Dec. 13, 2019, now Pat. No. 11,205,978.
(Continued)

(51) Int. Cl.
*H02N 13/00* (2006.01)
*C23F 1/00* (2006.01)
(Continued)

(52) U.S. Cl.
CPC .............. *H02N 13/00* (2013.01); *C23F 1/00* (2013.01); *C23C 16/453* (2013.01); *G02B 6/34* (2013.01);
(Continued)

(58) Field of Classification Search
CPC .......... H02N 13/00; C23F 1/00; H01L 21/78; H01L 21/67132; H01L 21/6836;
(Continued)

(56) References Cited

U.S. PATENT DOCUMENTS 6,146,504 A 11/2000 Patadia et al.
2007/0222131 A1 9/2007 Fukumoto et al.
(Continued)

FOREIGN PATENT DOCUMENTS

EP 0450713 A1 10/1991
WO 2007106332 A2 9/2007

OTHER PUBLICATIONS

European Search Report issued to Patent Application No. 19895899.3 dated Aug. 29, 2022.
(Continued)

*Primary Examiner* — Danny Nguyen
(74) *Attorney, Agent, or Firm* — Patterson & Sheridan, LLP

(57) ABSTRACT

Embodiments of the present disclosure generally relate to substrate support assemblies for retaining a surface of a substrate having one or more devices disposed on the surface without contacting the one or more devices and deforming the substrate, and a system having the same. In one embodiment, the substrate support assembly includes an edge ring coupled to a body of the substrate support assembly. A controller is coupled to actuated mechanisms of a plurality of pixels coupled to the body of the substrate support assembly such that portions of pixels corresponding to a portion of the surface of a substrate to be retained are (Continued)

positioned to support the portion without contacting one or more devices disposed on the surface of the substrate to be retained on the support surface.

20 Claims, 8 Drawing Sheets

Related U.S. Application Data

(60) Provisional application No. 62/780,025, filed on Dec. 14, 2018.

(51) Int. Cl.
| | |
|---|---|
| *G02B 6/34* | (2006.01) |
| *H01L 21/683* | (2006.01) |
| *C23C 16/453* | (2006.01) |
| *H05H 1/24* | (2006.01) |
| *H01L 21/265* | (2006.01) |

(52) U.S. Cl.
CPC .......... *H01L 21/265* (2013.01); *H01L 21/683* (2013.01); *H01L 21/6833* (2013.01); *H05H 1/24* (2013.01)

(58) Field of Classification Search
CPC . H01L 21/268; H01L 21/683; H01L 21/6833; H01L 21/6831; H01L 21/68714; H01L 21/6875; H01L 21/68771
USPC .......................................................... 361/234
See application file for complete search history.

(56) References Cited

U.S. PATENT DOCUMENTS

| | | |
|---|---|---|
| 2008/0037194 A1 | 2/2008 | Kamitani et al. |
| 2009/0200251 A1 | 8/2009 | Shimizu et al. |
| 2009/0255901 A1 | 10/2009 | Okita et al. |
| 2009/0273878 A1 | 11/2009 | Lee et al. |
| 2010/0059904 A1 | 3/2010 | Kasumi |
| 2011/0136699 A1 | 6/2011 | Shirazi |
| 2011/0206843 A1 | 8/2011 | Gurary et al. |
| 2012/0180726 A1 | 7/2012 | Han |
| 2013/0168353 A1 | 7/2013 | Okita et al. |
| 2014/0186946 A1 | 7/2014 | Davis et al. |
| 2014/0261698 A1 | 9/2014 | Krishnan et al. |
| 2016/0007479 A1* | 1/2016 | Hattori .............. H01L 21/67115 29/740 |
| 2016/0064267 A1 | 3/2016 | Toh et al. |
| 2018/0151435 A1* | 5/2018 | Chiang ............... H01L 23/3171 |

OTHER PUBLICATIONS

International Search Report/ Written Opinion issued to PCT/US2016/066170 dated Apr. 13, 2020.

Taiwan Office Action issued to Patent Application No. 108145757 dated Jan. 22, 2021.

Taiwan Office Action issued to Application No. 108145757 dated Sep. 27, 2021.

\* cited by examiner

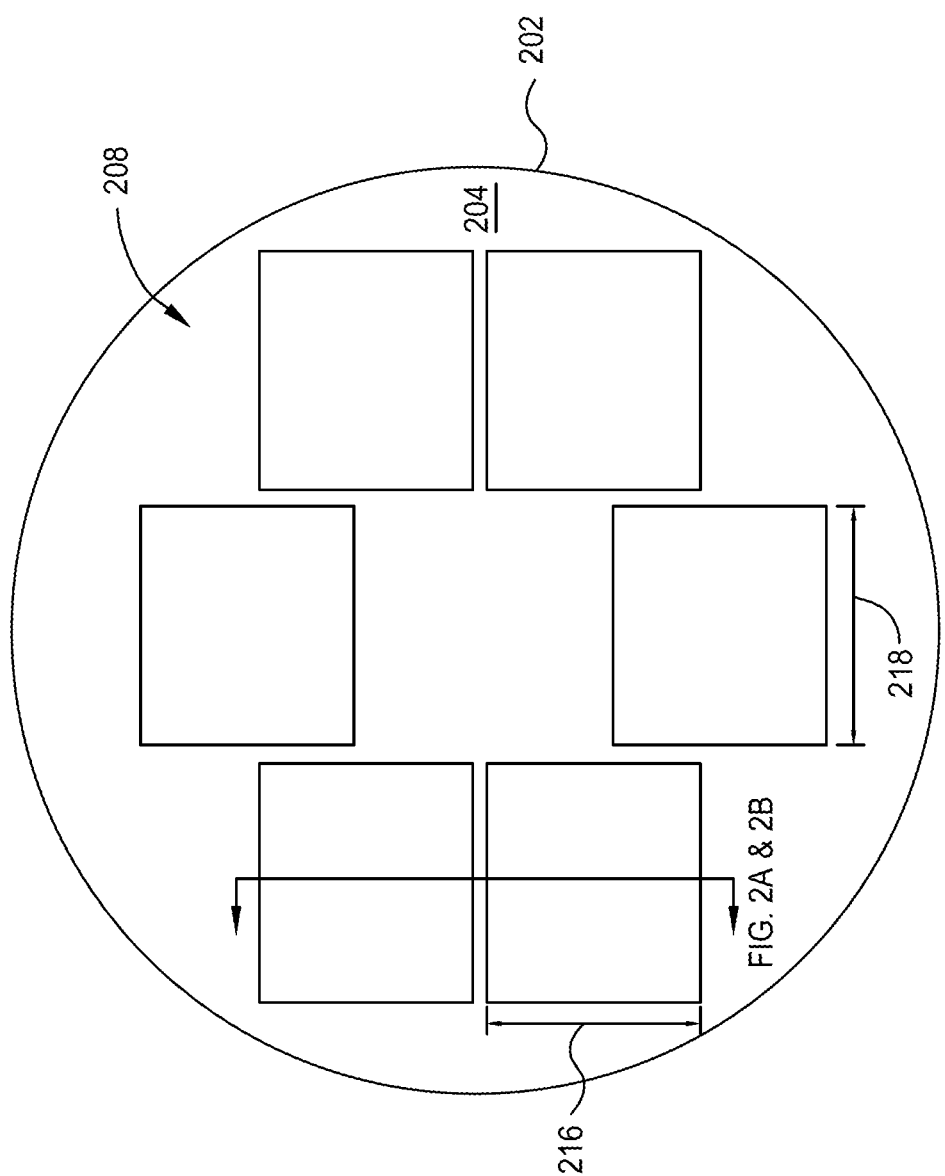

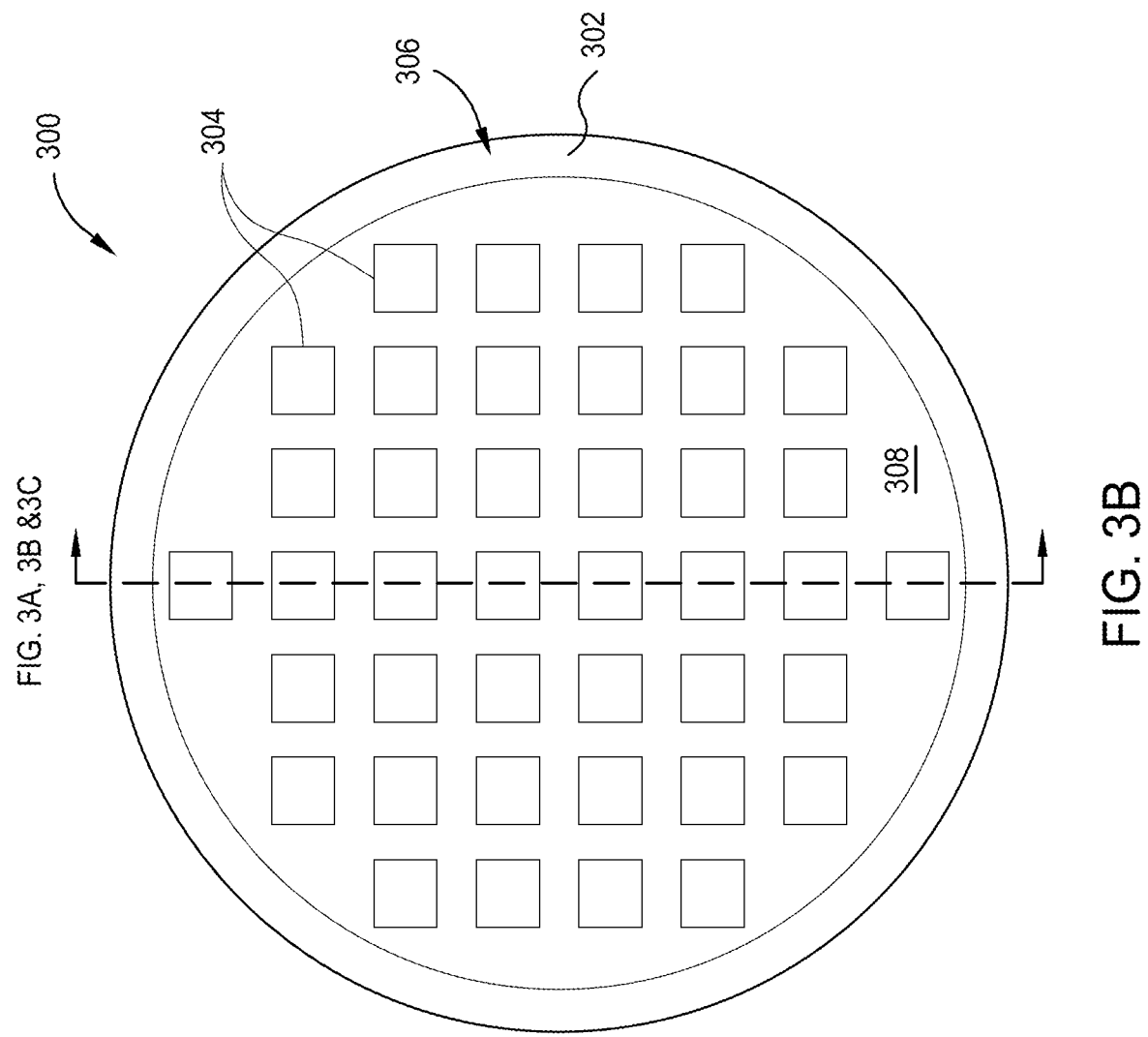

HANDLING AND PROCESSING DOUBLE-SIDED DEVICES ON FRAGILE SUBSTRATES

CROSS-REFERENCE TO RELATED APPLICATIONS

This application is a continuation application of U.S. patent application Ser. No. 16/713,744 which claims priority to U.S. Provisional Patent Application Ser. No. 62/780,025, filed on Dec. 14, 2018, which herein is incorporated by reference.

BACKGROUND

Field

Embodiments of the present disclosure generally relate to substrate support assemblies for retaining a surface of a substrate having one or more devices disposed on the surface without contacting the one or more devices and deforming the substrate, and a system having the same.

Description of the Related Art

In the manufacture of optical devices, one or more devices having structures with sub-micron critical dimensions are disposed on two or more sides of a substrate, such as a front side and a backside of the substrate. To manufacture optical devices, such as waveguide combiners, a surface of the substrate having the one or more devices disposed on the surface must be retained on a substrate support assembly without contacting the one or more devices. Contacting the one or more devices may damage the devices. Furthermore, the substrate may include fragile materials, such as glass, and may have a thickness less than about 1 millimeter (mm). The combination of the fragile materials and the thickness may result in deformation of the substrate. Accordingly, what is needed in the art is substrate support assemblies for retaining a surface of a substrate having one or more devices disposed on the surface without contacting the one or more devices and deforming the substrate, and a system having the same.

SUMMARY

In one embodiment, a substrate support assembly is provided. The substrate support assembly includes a plurality of projections coupled to a body of the substrate support assembly. Each of the plurality of projections have a support surface corresponding to a portion of a surface of a substrate to be retained on the support surface. A plurality of pockets are defined by adjacent projections of the plurality of projections. Each of the plurality of pockets has a pocket width corresponding to a width of one or more devices disposed on the surface of the substrate to be retained on the support surface, a pocket length corresponding to a length of the one or more devices disposed on the surface of the substrate to be retained on the support surface, and a pocket conduit operable to be in fluid communication with a vacuum source via a vacuum flow controller and operable to be in fluid communication with a gas source via a gas flow controller.

In another embodiment, a substrate support assembly is provided. The substrate support assembly includes an edge ring coupled to a plate. The edge ring has a support surface corresponding to a portion of a surface of a substrate to be retained on the support surface. A plurality of pixels are coupled to a plurality of actuated mechanisms coupled to the substrate support assembly. Each of the plurality of pixels correspond to an actuated mechanism of the plurality of actuated mechanisms. A controller is coupled to each actuated mechanism such that portions of pixels corresponding to the portions of the surface of the substrate to be retained are positioned to support the portions without contacting one or more devices disposed on the surface of the substrate to be retained on the support surface.

In yet another embodiment, a substrate support assembly is provided. The substrate support assembly includes an edge ring coupled to a plate. The edge ring has a support surface corresponding to a portion of a surface of a substrate to be retained on the support surface. The substrate support assembly includes a plurality of pixels and a pixel support plate coupled to an actuated mechanism. The pixel support plate has a pattern of a plurality of holes corresponding to one or more devices of the portion of the surface of the substrate to be retained such that each pixel of the plurality of pixels raised to a support position does not contact the one or more devices.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2C is a schematic, top view of a substrate support assembly according to an embodiment.

FIG. 3B is a schematic, top view of a substrate support assembly according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate support assemblies for retaining a surface of a substrate having one or more optical devices disposed on the surface without contacting the one or more optical devices and deforming the substrate, and a system having the same. The substrate support assemblies described herein provide for the retention of a substrate without contacting the one or more optical devices formed on the substrate and without deforming the substrate, including fragile materials having a thickness less than about 1 mm.

Figure 1:
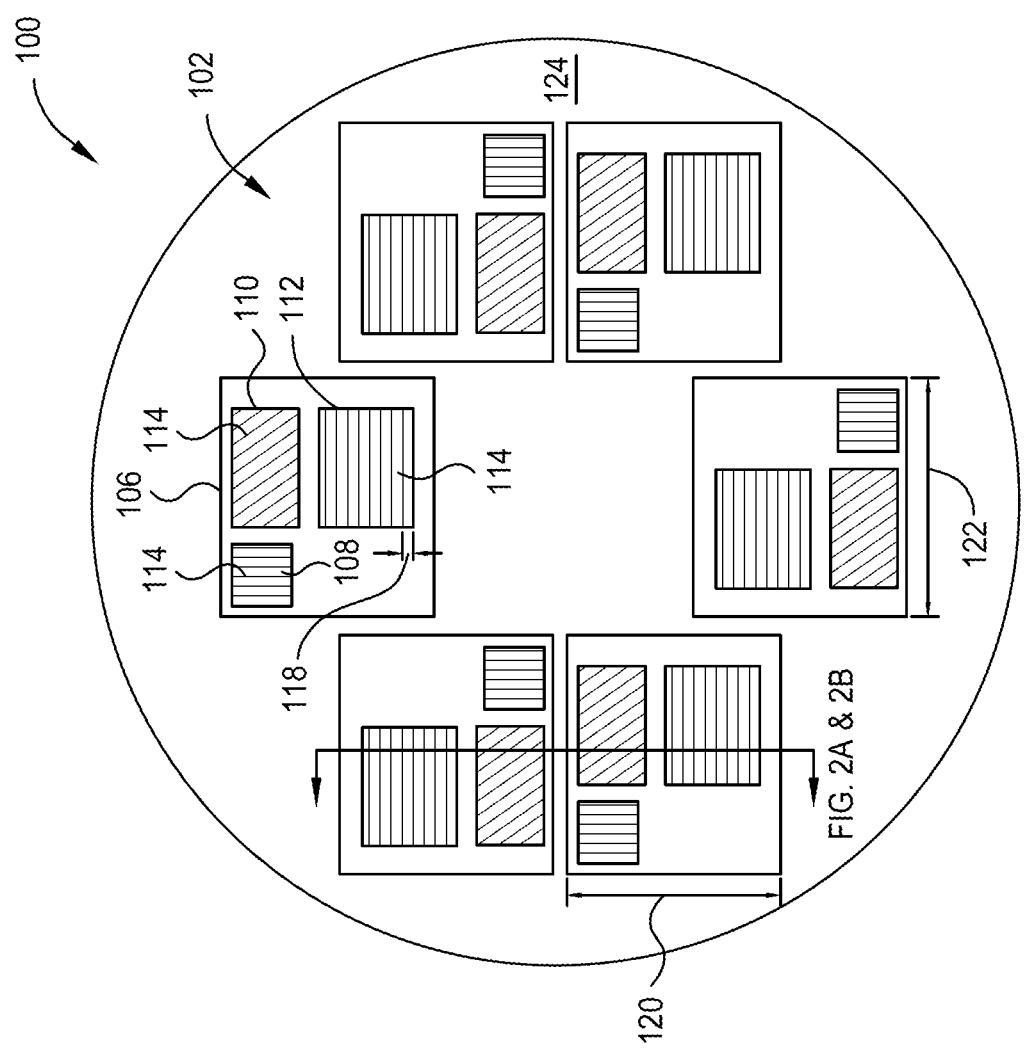
FIG. 1 is a schematic, top view of a first surface of a substrate according to an embodiment.

FIG. 1 is a perspective, frontal view of a first surface 102 (i.e., top surface) of the substrate 100. The substrate 100 includes a second surface 104 (i.e., bottom surface) opposite the first surface 102. The substrate 100 may be glass, plastic, and polycarbonate, or any other suitable material. The materials may have rollable and flexible properties. In one embodiment, which can be combined with other embodiments described herein, the substrate 100 has a thickness 116 (shown in FIGS. 2A, 2B, 3C, and 3D) less than about 1 millimeter (mm). In some embodiments, the thickness is less than 0.5 mm. The substrate 100 includes one or more optical devices 106, such as waveguide combiners, disposed on the first surface 102 and/or the second surface 104 of the substrate. The one or more optical devices 106 can include one or more gratings, such as an input grating 108, an intermediate grating 110, and an output grating 112. Each of the input grating 108, an intermediate grating 110, and an output grating 112 include structures 114 (i.e., fins) having sub-micron critical dimensions, e.g., nano-sized critical dimensions. In one embodiment, which can be combined with other embodiments described herein, the one or more optical devices 106 include structures 114 having critical dimensions 118 less than 1 micrometer (μm).

Figure 2A:
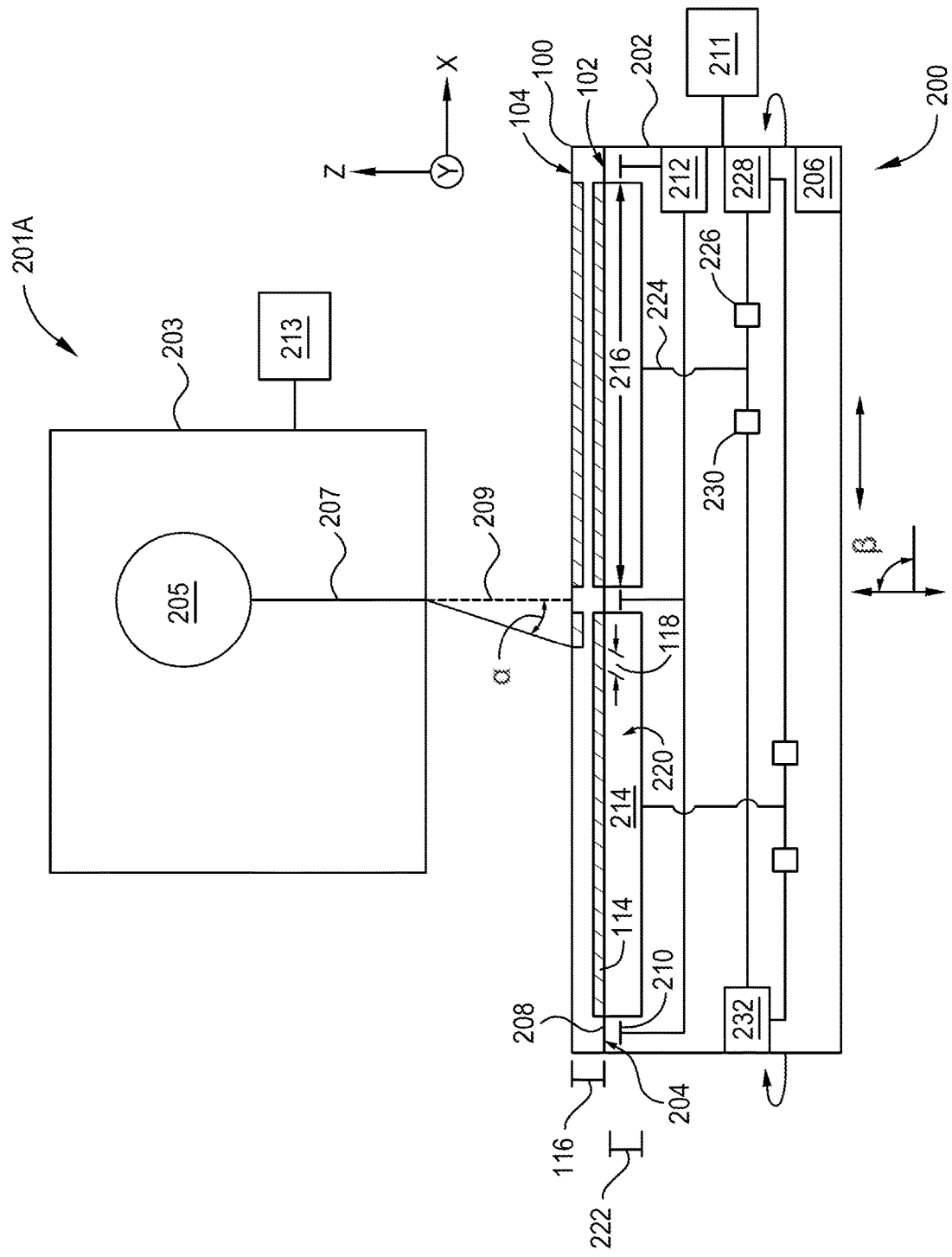
FIG. 2A is a schematic, cross-sectional view of a system including a substrate support assembly according to an embodiment.

The embodiments of the substrate support assembly 200 (shown in FIGS. 2A and 2B) and substrate support assembly 300 (shown in FIGS. 3A-3D) described herein are operable to retain the substrate 100 having one or more optical devices 106 without contacting the structures 114 and without deforming the substrate 100. FIG. 2A is a schematic, cross-sectional view of a system 201A including a substrate support assembly 200. The system 201A is shown configured as an angled etch system, such as the Varian VIISta® Raptor DRB® system available from Applied Materials, Inc. located in Santa Clara, Calif. It is to be understood that the system 201A described below is an exemplary system and other systems, including systems from other manufacturers, may be used with or modified to include the substrate support assembly 200. For example, the substrate support assembly 200 may be utilized in chemical vapor deposition (CVD) systems, plasma-enhanced CVD (PECVD) systems, ion implantation chambers, among others, as well as other systems utilized in manufacturing optical devices.

The system 201A includes an ion beam chamber 203 that houses an ion beam source 205. The ion beam source 205 is configured to generate an ion beam 207, such as a ribbon beam, a spot beam, or a full substrate-size beam. The ion beam 207 is operable to form the structures 114 having sub-micron critical dimensions in the substrate 100 or material disposed on the substrate 100. The ion beam chamber 203 is configured to direct the ion beam 207 at an optimized angle α relative to a surface normal 209 of a substrate 100. The substrate 100 is retained on a support surface 204 of the substrate support assembly 200 described in further detail herein. In one embodiment, which can be combined with other embodiments described herein, a body 202 of the substrate support assembly 200 is coupled to an actuator 211. The actuator 211, in operation, moves the body 202 in a scanning motion along a y-direction and/or a z-direction. In one embodiment, which can be combined with other embodiments described herein, the actuator 211, in operation, tilts the body 202 such that the substrate 100 is positioned at a tilt angle β relative to the x-axis of the ion beam chamber 203. In another embodiment, which can be combined with other embodiments described herein, the actuator 211, in operation, rotates the substrate 100 about the x-axis of the body 202. The substrate support assembly 200 includes a controller 206 operable to be in communication with a system controller 213 and is operable to control aspects of the substrate support assembly 200 during processing.

Figure 2B:
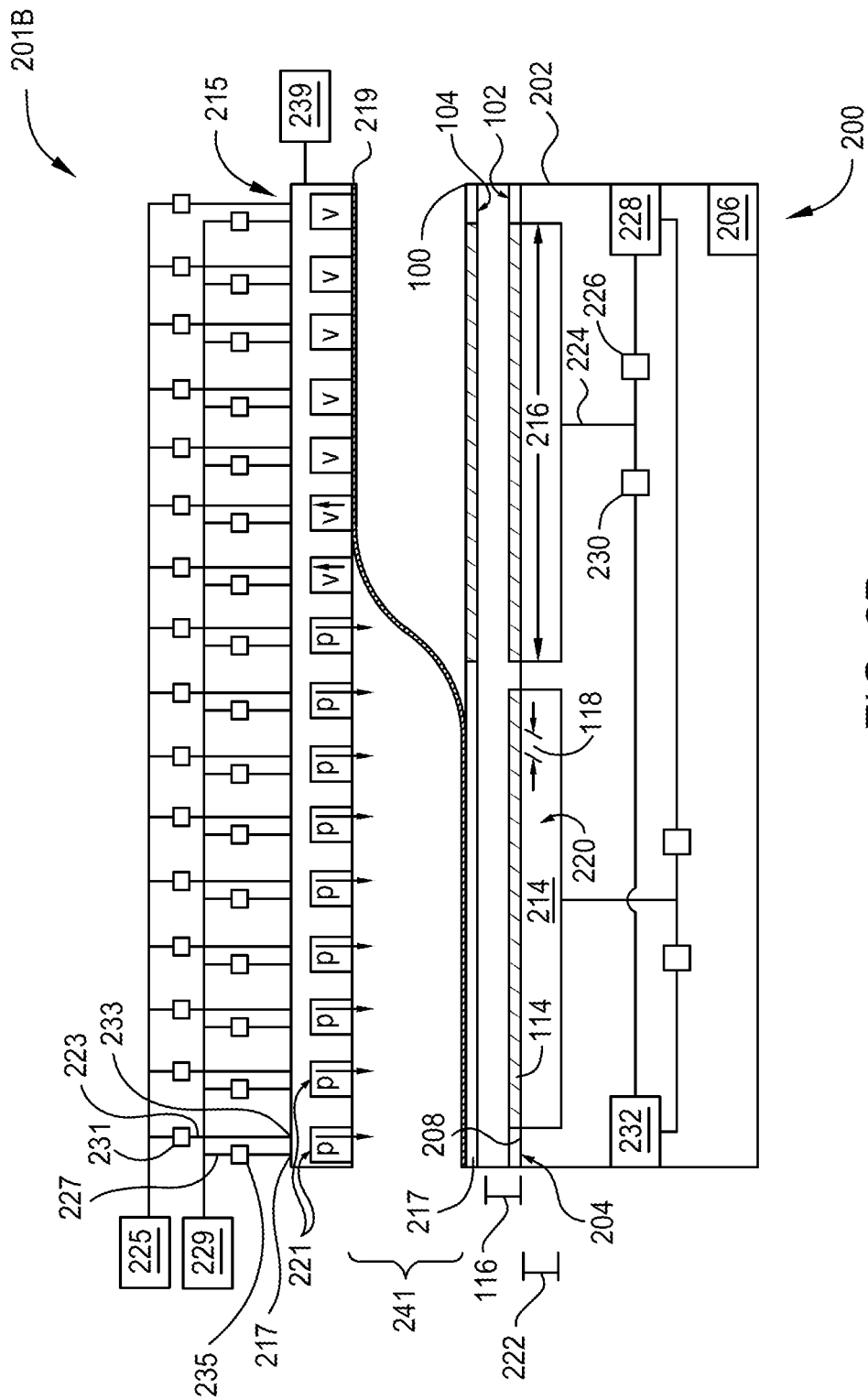
FIG. 2B is a schematic, cross-sectional view of a system including a substrate support assembly according to an embodiment.

FIG. 2B is a schematic, cross-sectional view of a system 201B including the substrate support assembly 200. The system 201B is shown configured as a nano-imprint lithography system. The system 201B includes a stamp holder 215 operable to contact and release a stamp 219 into an imprint material 217 disposed on the substrate 100 to form structures 114 having sub-micron critical dimensions in the imprint material 217 disposed on the substrate 100. The stamp holder 215 is operable to contact and release the stamp 219 into the imprint material 217 via pressure differentials in a region 241 defined between the stamp holder 215 and the support surface 204 of the substrate support assembly 200. In one embodiment, which can be combined with other embodiments described herein, the stamp holder 215 includes a plurality of ports 221. The plurality of ports 221 are coupled to a plurality of pressure lines 223 and a plurality of vacuum lines 227. The plurality of pressure lines 223 are coupled to a pressure manifold 225. The plurality of vacuum lines 227 are coupled to a vacuum manifold 229. The pressure manifold 225 is operable to supply pressure through the ports 221 to the region 241 to force portions of a stamp 219 corresponding to the ports 221 having pressure supplied by the pressure manifold 225 to contact the imprint material 217 of the substrate 100. The vacuum manifold 229 is operable to supply vacuum through the ports 221 to the region 241 to release portions of a stamp 219 corresponding to the ports 221 having vacuum supplied by the vacuum manifold 229 from contact with the imprint material 217 of the substrate 100.

Each port of the plurality of ports 221 is coupled to the pressure manifold 225 via a respective pressure line of the plurality of pressure lines 223. Each pressure line has a flow controller 231, such as a mass flow controller (MFC), disposed between a pressure line outlet 233 and the pressure manifold 225. Each port of the plurality of ports 221 is coupled to the vacuum manifold 229 via a respective vacuum line of the plurality of vacuum lines 227. Each vacuum line has a flow controller 235, such as a MFC, disposed between an vacuum line outlet 237 and the vacuum manifold 229. Each flow controller 231 of the plurality of pressure lines 223 and each flow controller 235 of the plurality of vacuum lines 227 is coupled to a system controller 239. The system controller 239 is operable to operate each flow controller 231 and each flow controller 235 such that portions of the stamp 219 are able to contact and release from the imprint material 217 according to embodiments described herein.

As shown in FIGS. 2A and 2B, and FIG. 2C, a schematic, top view of the substrate support assembly 200. The body 202 of the substrate support assembly 200 includes a plurality of projections 208. In some embodiments, shown in FIG. 2A, which can be combined with other embodiments described herein, each projection of the plurality of projections 208 includes a chucking electrode 210 disposed therein. Each chucking electrode 210 may be configured in a monopolar electrode, bipolar electrode, or other suitable arrangement. Each chucking electrode 210 is coupled to a chucking power source 212, which provides DC power to electrostatically secure the substrate 100 to the support surface 204 of the plurality of projections 208. In one embodiment, which can be combined with other embodiments described herein, the body 202 and the projections 208 include stainless steel and/or aluminum containing materials. In another embodiment, which can be combined with other embodiments described herein, the body 202 and the projections 208 include ceramic containing materials.

The first surface 102 (i.e., top surface) of the substrate 100 is securable to the support surface 204 of the plurality of projections 208 without the one or more optical devices 106 contacting the support surface 204. Adjacent projections of the plurality of projections 208 form pockets 214. The pockets 214 have a width 216 and a length 218 corresponding to a width 120 and a length 122 (as shown in FIG. 1) of the one or more optical devices 106. The plurality of projections 208 correspond to portions 124 of one of the first surface 102 and the second surface 104 without one of the optical devices 106 disposed thereon. When the substrate 100 is secured to the support surface 204 of the substrate support assembly 200, regions 220 are formed, in each of the pockets 214, between the body 202 of the substrate support assembly 200 and the optical devices 106 of one of the first surface 102 and second surface 104 secured to the support surface 204.

In one embodiment, which can be combined with other embodiments described herein, the width 216 and the length 218 of one or more of the pockets 214 are different. The width 216 and the length 218 of one or more of the pockets 214 are different such that the plurality of projections 208 are operable to support the substrate 100 having one or more optical devices 106 with a different width 120 and a different length 122. In another embodiment, the width 216 and the length 218 are the same. In one embodiment, which can be combined with other embodiments described herein, the width 216 and the length 218 are about 20 mm to about 60 mm. In one embodiment, which can be combined with other embodiments described herein, a depth 222 of the one or more of the pockets 214 is about 0.5 mm to 1 mm. In another embodiment, which can be combined with other embodiments described herein, the depth 222 is about 0.02 mm or less.

Each of the pockets 214 are operable to be coupled to a pocket conduit 224 in fluid communication with a vacuum source 228 via a vacuum flow controller 226, such as a MFC, and each of the pockets 214 are operable to be coupled to the pocket conduit 224 in fluid communication with a gas source 232 via a gas flow controller 230. The vacuum manifold 229 is operable to supply vacuum pressure through a respective pocket conduit 224 to a respective pocket 214 to retain portions of the substrate 100 corresponding to the support surface 204 of the projections 208 by maintaining a vacuum pressure in a respective region 220. In one embodiment, which can be combined with other embodiments described herein, the vacuum pressure is about 380 Torr to about 760 Torr. The gas source 232 is operable to provide gas through a respective pocket conduit 224 to a respective pocket 214 to perfrom at least one of pressurize the respective region 220, maintain the substrate 100 at a cryogenic processing temperature, and release the portions of the substrate 100 from the support surface 204 of the projections 208. The controller 206 is operable to operate each vacuum flow controller 226 and each gas flow controller 230 according to embodiments described herein.

In one embodiment, which can be combined with other embodiments, the gas source 232 is operable to flow inert gas though the pocket conduit 224 to pressurize the regions 220. In the embodiments shown in FIG. 2A, the pressurized regions 220 neutralize substrate deformation, such as deformation of the one or more optical devices 106, when the portions 124 are secured to the support surface 204 via forces generated by the chucking electrode 210 of each of the plurality of projections 208. The inert gas may include hydrogen gas ($H_2$), helium (He), argon (Ar), and/or nitrogen gas ($N_2$).

In another embodiment, which can be combined with other embodiments described herein, the inert gas has a cryogenic temperature less than −50 degrees Celsius to maintain the substrate 100 at a cryogenic processing temperature less than about −20 degrees Celsius. Maintaining the substrate 100 at a cryogenic processing temperature allows for etching of the one or the first surface 102 and second surface 104 to form structures 114 with smooth sidewalls. For example, ion etching, as shown in FIG. 2A, the substrate 100 maintained at the cryogenic processing temperature enables ions to bombard the upward-facing surfaces of materials disposed on the substrate 100 with decreased spontaneous etching. Additionally, the selectivity of etching one material versus another can be improved at the cryogenic processing temperature. For example, selectivity between silicon (Si) and silicon dioxide ($SiO_2$) increases exponentially as the temperature is decreased. In one embodiment, which can be combined with other embodiments described herein, the backside cooling pressure in the regions 220 is about 2 Torr to about 50 Torr.

In yet another embodiment, as shown in FIG. 2B, which can be combined with other embodiments described herein, the first surface 102 (i.e., top surface) of the substrate 100 is securable to the support surface 204 of the plurality of projections 208 without the one or more optical devices 106 contacting the support surface 204. The substrate 100 is retained on the support surface 204 by maintaining the vacuum pressure in the regions 220. As described above, the pressure manifold 225 is operable to supply pressure through the ports 221 to the region 241 to force portions of a stamp 219 corresponding to the ports 221 having pressure supplied by the pressure manifold 225 to contact the imprint material 217 of the substrate 100. As the stamp 219 is removed from portions of the second surface 104, the regions 220 corresponding to the portions of the second surface 104 are pressurized by the gas source 232. As described above, the vacuum manifold 229 is operable to supply vacuum through the ports 221 to the region 241 to release portions of a stamp 219 corresponding to the ports 221 having vacuum supplied by the vacuum manifold 229 from contact with the imprint material 217 of the substrate 100. Deformation of the structures 114 of the one or more optical devices 106 may occur due to the pressure differential in the region 241. Thus, the pressurized regions 220 neutralize substrate deformation when the stamp 219 is release by the stamp holder 215.

Figure 3A:
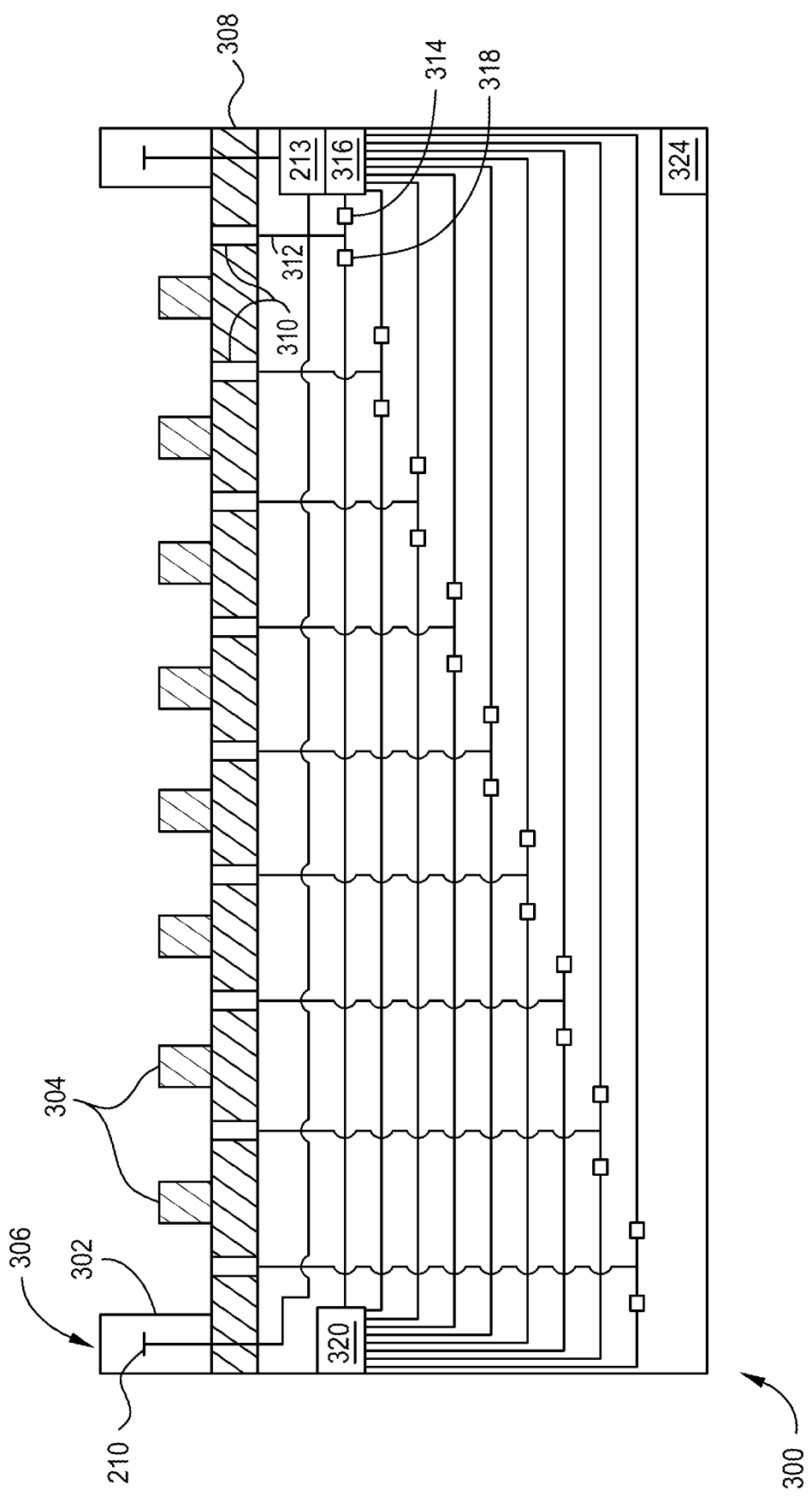
FIGS. 3A, 3C, and 3D are schematic, cross-sectional views of a substrate support assembly according to an embodiment.
Figure 3C:
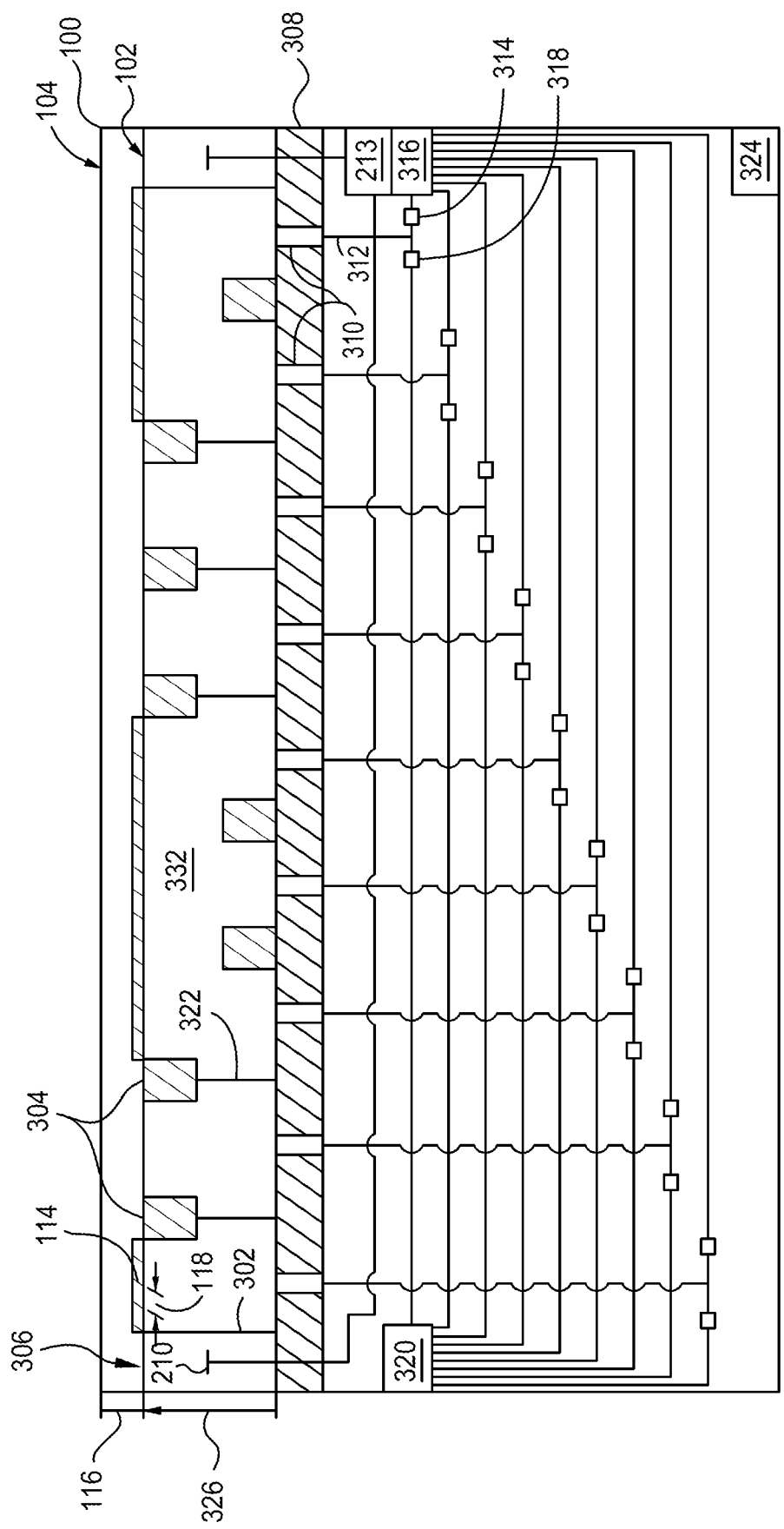
Figure 3D:
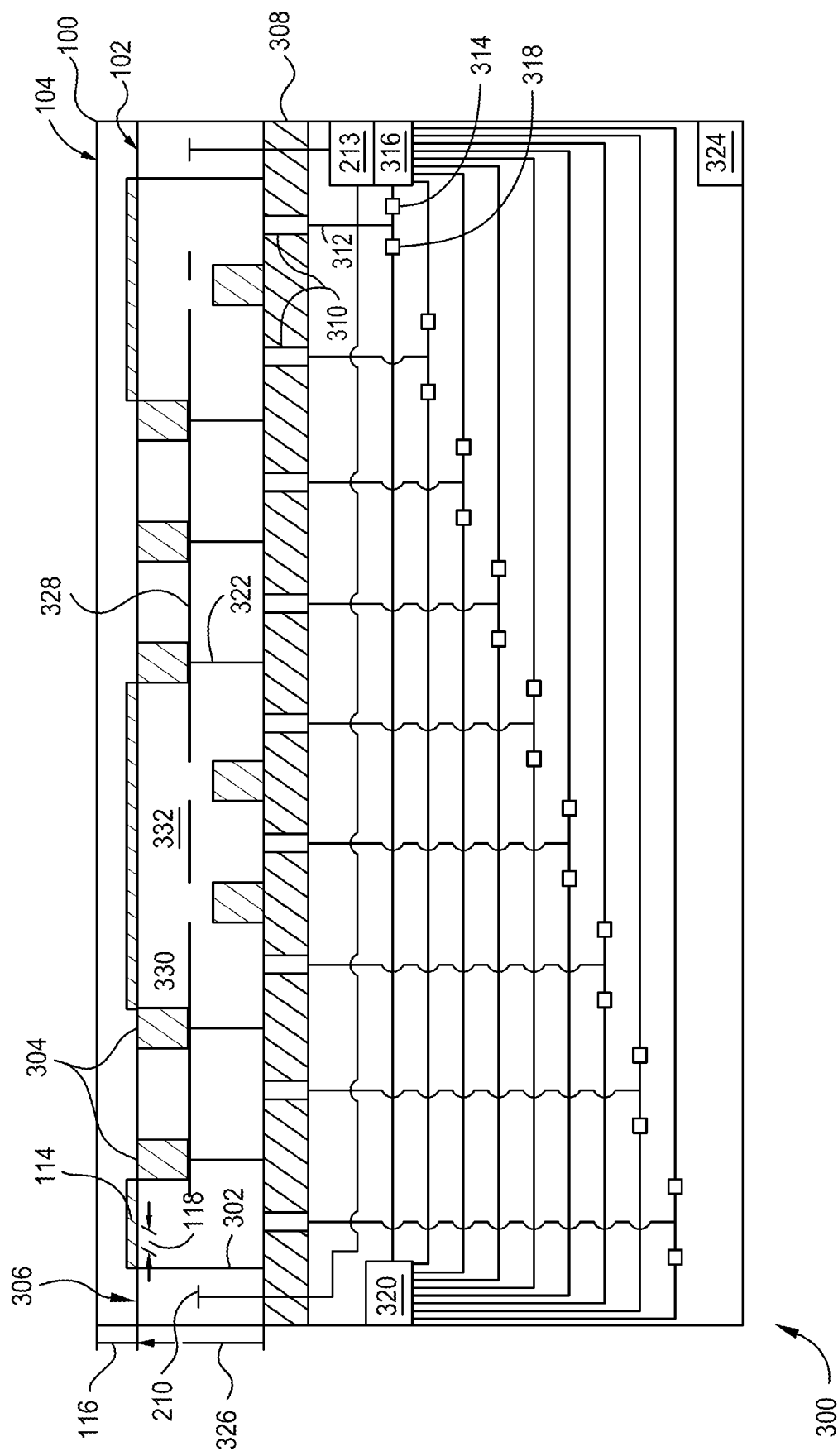

FIGS. 3A, 3C, and 3D are schematic, cross-sectional views of a substrate support assembly 300. FIG. 3B is a schematic, top view of the substrate support assembly 300. The substrate support assembly 300 includes an edge ring 302 and a plurality of pixels 304. The edge ring 302 includes a support surface 306. In one embodiment, which can be combined with other embodiments described herein, the edge ring 302 and the plurality of pixels 304 include stainless steel and/or aluminum containing materials. In another embodiment, which can be combined with other embodiments described herein, the edge ring 302 and the plurality of pixels 304 include ceramic containing materials.

In one embodiment, which can be combined with other embodiments described herein, the edge ring 302 includes the chucking electrode 210 disposed therein. The chucking electrode 210 coupled to the chucking power source 212, which provides a DC power to electrostatically secure the substrate 100 to the support surface 306 of the edge ring 302. In another embodiment, which can be combined with other embodiments described herein, the substrate support assembly 300 includes a plate 308 having a plurality of channels 310. Each channel of the plurality of channels 310 is coupled to a channel conduit 312 operable to be in fluid communication with a vacuum source 316 via a vacuum flow controller 314, such as an MFC. Each channel conduit 312 is operable to be in fluid communication with a gas source 320 via a gas flow controller 318. A controller 324 is operable to operate each vacuum flow controller 314 and each gas flow controller 318 according to embodiments described herein.

As shown in FIG. 3C, each pixel of the plurality of pixels 304 includes an actuated mechanism 322 coupled to the controller 324. The actuated mechanism 322 includes a mechanism operable to raise a pixel of the plurality of pixels 304 to a support position 326, shown in FIG. 3C. For example, the actuated mechanism 322 includes at least one of a spring mechanism, a magnet mechanism, and a pneumatic mechanism. The controller 324 is operable to individually control the actuated mechanism 322 of each of the plurality of pixels 304 such that a portion of the plurality of pixels 304 is raised. Each of the plurality of pixels 304 are individually controlled such that the substrate support assembly 300 is operable to support the substrate 100 having one or more optical devices 106 with a different width 120 and a different length 122 without contracting the optical devices 106. Additionally, the individually controlled plurality of pixels 304 provides for supporting various configurations of the substrate 100 having one or more optical devices 106.

As shown in FIG. 3D, the substrate support assembly 300 includes a pixel support plate 328. The pixel support plate 328 is coupled to an actuated mechanism 322. The pixel support plate 328 includes a pattern of a plurality of holes 330. Each hole of the plurality of holes 330 corresponds to the one or more optical devices 106 such that each pixel of the plurality of pixels 304 not in the support position 326 does not contact the one or more optical devices 106. The controller 324 is operable to control the actuated mechanism 322 such that a portion of the plurality of pixels 304 is raised by the pixel support plate 328. Raising the pixel support plate 328 positions the portion of the plurality of pixels 304 in the support position 326, shown in FIG. 3D. The support position 326, as shown in FIGS. 3C and 3D, of the portion of the plurality of pixels 304 corresponds to the portions 124 of one of the first surface 102 and the second surface 104 to be supported by the support surface 306 of the edge ring 302 and the portion of the plurality of pixels 304. The pixel support plate 328 is interchangeable such that pixel support plates having different patterns of the plurality of holes 330 may be utilized to support various configurations of the substrate 100 having one or more optical devices 106.

The support position 326 is a depth from the support surface 306 of the one or more raised pixels 304 to the plate 308. In one embodiment, which can be combined with other embodiments described herein, the depth of the support position 326 is about 0.5 mm to 1 mm. In another embodiment, which can be combined with other embodiments described herein, the depth of the support position 326 is about 0.02 mm or less. When the substrate 100 is secured to the support surface 306 of the edge ring 302 and the portion of the plurality of pixels 304, regions 332 are formed between adjacent pixels 304 and the edge ring 302 and pixels 304 adjacent to the edge ring. In one embodiment, which can be combined with other embodiments, the gas source 320 is operable to flow inert gas though channel conduits 312 to pressurize the regions 332. In embodiments with use of the system 201A, which can be combined with other embodiments described herein, the pressurized regions 332 neutralize substrate deformation, such as deformation of the one or more optical devices 106, when the portions 124 are secured to the support surface 306 via forces generated by the chucking electrode 210.

In another embodiment, which can be combined with other embodiments described herein, the inert gas has a cryogenic temperature less than −50 degrees Celsius to maintain the substrate 100 at a cryogenic processing temperature less than about −20 degrees Celsius. In one embodiment, which can be combined with other embodiments described herein, the backside cooling pressure in the regions 332 is about 2 Torr to about 50 Torr. regions 332

In embodiments with use of the system 201B, which can be combined with other embodiments described herein, the first surface 102 (i.e., top surface) of the substrate 100 is securable to the support surface 306 of the plurality of pixels 304 without the one or more optical devices 106 contacting the support surface 306. The substrate 100 is retained on the support surface 306 by maintaining the vacuum pressure in the regions 332. In one embodiment, which can be combined with other embodiments described herein, the vacuum pressure is about 380 Torr to about 760 Torr. As the stamp 219 is removed from portions of the second surface 104, the regions 332 corresponding to the portions of the second surface 104 are pressurized by the gas source 320. Deformation of the structures 114 of the one or more optical devices 106 may occur due to the pressure differential in the region 241. Thus, the pressurized regions 332 neutralize substrate deformation when the stamp 219 is released by the stamp holder 215.

In summation, substrate support assemblies for retaining a surface of a substrate having one or more devices disposed on the surface without contacting the one or more devices, and system having the same are provided. The substrate support assemblies described herein provide for the retention of a substrate without contacting the one or more devices formed on the substrate and without deforming the substrate including fragile materials having a thickness less than about 1 mm.

While the foregoing is directed to examples of the present disclosure, other and further examples of the disclosure may be devised without departing from the basic scope thereof, and the scope thereof is determined by the claims that follow.

What is claimed is:
1. An optical device fabrication method, comprising:
retaining a first surface of an optical device substrate on a substrate support assembly, the first surface of the optical device substrate having one or more devices disposed thereon, the retaining the first surface on the substrate support assembly comprising:
disposing the first surface on a plurality of projections coupled to a body of the substrate support assembly to form pockets defined by adjacent projections, the one or more devices disposed on the first surface and the body;
forcing a stamp to contact an imprint material disposed on a second surface of the optical device substrate opposing the first surface; and
releasing the stamp from portions of the second surface and pressurizing the pockets corresponding to the portions of the second surface, the pressurizing the pockets comprising flowing gas from a gas source to the pockets through pocket conduits in fluid communication with the gas source and the pockets.

2. The optical device fabrication method of claim 1, further comprising providing power to a chucking electrode disposed in each of the plurality of projections to retain the first surface of the optical device substrate on the substrate support assembly.

3. The optical device fabrication method of claim of claim 2, wherein the chucking electrode is configured in a monopolar or bipolar electrode arrangement.

4. The optical device fabrication method of claim 1, wherein contacting the imprint material disposed on the second surface forms one or more second devices.

5. The optical device fabrication method of claim 4, wherein the one or more second devices include first structures having sub-micron critical dimensions.

6. The optical device fabrication method of claim 1, further comprising generating vacuum pressure from a vacuum source to the pockets through the pocket conduits in fluid communication with the vacuum source and the pockets to retain the first surface of the optical device substrate on the substrate support assembly.

7. The optical device fabrication method of claim 1, wherein the gas is an inert gas.

8. The optical device fabrication method of claim 1, wherein the one or more devices of the first surface include first structures having sub-micron critical dimensions.

9. The optical device fabrication method of claim 1, wherein a depth of the pockets is about 0.5 mm to 1 mm.

10. The optical device fabrication method of claim 1, wherein a depth of the pockets is about 0.02 mm or less.

11. An optical device fabrication method, comprising:
retaining a first surface of an optical device substrate on a substrate support assembly, the first surface of the optical device having one or more first devices disposed thereon, the retaining the first surface on the substrate support assembly comprising:
disposing the first surface on a plurality of projections coupled to a body of the substrate support assembly to form pockets defined by adjacent projections, the one or more devices disposed on the first surface and the body; and
providing power to a chucking electrode disposed in each of the plurality of projections;
forcing a stamp to contact an imprint material disposed on a second surface of the optical device substrate opposing the first surface to form one or more second devices; and
releasing the stamp from portions of the second surface and pressurizing the pockets corresponding to portions of the second surface, the pressurizing the pockets comprising flowing gas from a gas source to the pockets through pocket conduits in fluid communication with the gas source and the pockets.

12. The optical device fabrication method of claim 11, wherein contacting the imprint material disposed on the second surface forms one or more second devices.

13. The optical device fabrication method of claim 12, wherein the one or more second devices include first structures having sub-micron critical dimensions.

14. An optical device fabrication method, comprising:
retaining a first surface of an optical device substrate on a substrate support assembly, the first surface of the optical device having one or more devices disposed thereon, the retaining the first surface on the substrate support assembly comprising:
disposing the first surface on a plurality of projections coupled to a body of the substrate support assembly to form pockets defined by adjacent projections, the one or more devices disposed on the first surface and the body; and
maintaining the optical device substrate at a cryogenic processing temperature, the maintaining the optical device substrate at the cryogenic processing temperature comprising:
flowing gas from a gas source to the pockets through pocket conduits in fluid communication with the gas source and the pockets, the gas having a cryogenic temperature less than −50 degrees Celsius.

15. The optical device fabrication method of claim 14, wherein an ion beam is projected to a second surface of the optical device substrate opposing the first surface, the ion beam forming one or more second devices.

16. The optical device fabrication method of claim 15, wherein the one or more second devices include first structures having sub-micron critical dimensions.

17. The optical device fabrication method of claim 14, further comprising providing power to a chucking electrode disposed in each of the plurality of projections to retain the first surface of the optical device substrate on the substrate support assembly.

18. The optical device fabrication method of claim 17, wherein the chucking electrode is configured in a monopolar or bipolar electrode arrangement.

19. The optical device fabrication method of claim 14, wherein a depth of the pockets is about 0.5 mm to 1 mm.

20. The optical device fabrication method of claim 14, wherein a depth of the pockets is about 0.02 mm or less.

* * * * *